(12) United States Patent
Hwang et al.

(10) Patent No.: US 7,463,131 B1
(45) Date of Patent: Dec. 9, 2008

(54) PATTERNED MAGNETIC LAYER ON-CHIP INDUCTOR

(75) Inventors: Kyuwoon Hwang, Palo Alto, CA (US); Peter J. Hopper, San Jose, CA (US); Robert Drury, Palo Alto, CA (US); Peter Johnson, Sunnyvale, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 130 days.

(21) Appl. No.: 11/111,660

(22) Filed: Apr. 21, 2005

Related U.S. Application Data

(63) Continuation-in-part of application No. 11/041,658, filed on Jan. 24, 2005, now Pat. No. 7,268,410.

(51) Int. Cl.
*H01F 5/00* (2006.01)
(52) U.S. Cl. ..................................... 336/200
(58) Field of Classification Search ................. 336/200
See application file for complete search history.

(56) References Cited

U.S. PATENT DOCUMENTS

| | | | | |
|---|---|---|---|---|
| 4,907,346 A | * | 3/1990 | Watanabe ................ | 33/361 |
| 4,956,636 A | * | 9/1990 | Sansom et al. ........... | 340/551 |
| 6,491,229 B1 | * | 12/2002 | Berney .................... | 235/492 |
| 7,140,092 B2 | * | 11/2006 | Park et al. ............... | 29/602.1 |
| 2005/0140483 A1 | * | 6/2005 | Wobben .................. | 336/182 |

* cited by examiner

*Primary Examiner*—Elvin Enad
*Assistant Examiner*—Joselito Baisa
(74) *Attorney, Agent, or Firm*—Stallman & Pollock LLP

(57) ABSTRACT

An on-chip inductor structure includes top and bottom metal plates that are formed to surround a conductor coil formed between the top and bottom plates, but is separated therefrom by intervening dielectric material. The top and bottom plates are preferably formed from a ferromagnetic alloy, e.g. Permalloy, and are subdivided into a plurality of space-apart segments, thereby reducing eddy currents. The number of segments is optimized based upon the process technology utilized to fabricate the structure. Preferably, a finite gap is formed between the top plate and the bottom plate, the height of the gap being chosen to adjust the total inductance of the structure.

13 Claims, 3 Drawing Sheets ns
PATTERNED MAGNETIC LAYER ON-CHIP INDUCTOR

RELATED APPLICATION

This application is a Continuation-In-Part of and commonly assigned application Ser. No. 11/041,658, filed on Jan. 24, 2005 now U.S. Pat. No. 7,268,410, by Peter J. Hopper, Peter Johnson, Kyuwoon Hwang and Robert Drury, titled "Integrated Switching Voltage Regulator Using Copper Process Technology." application Ser. No. 11/041,658 is hereby incorporated by reference in its entirety.

TECHNICAL FIELD

The present invention relates to integrated circuit structures and, in particular, to an on-chip inductor structure that includes conductor cells sandwiched between top and bottom magnetic layers; the magnetic layers are patterned to reduce the eddy current effect.

DESCRIPTION OF THE INVENTION

Figure 1A:
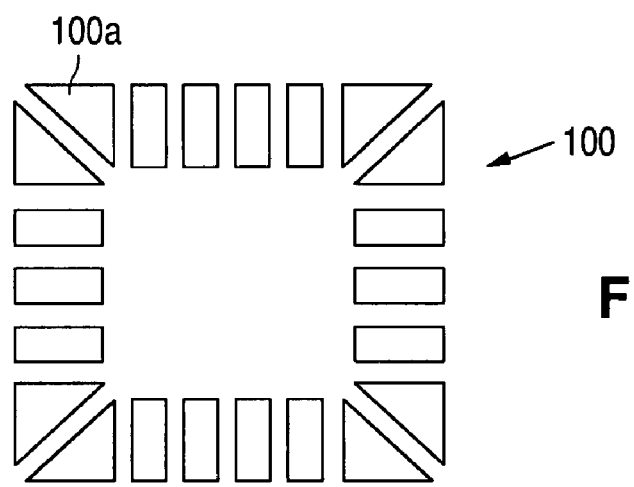
FIGS. 1A-1C are top views illustrating the top patterned magnetic plates, the conductor spiral and the bottom patterned magnetic plates, respectively, of an embodiment of a spiral inductor structure in accordance with the concepts of the present invention.

According to Faraday's law, any change in the magnetic environment of a coil of wire will cause a voltage (emf) to be "induced" in the coil. No matter how the change is produced, the voltage will be generated. For example, the change could be produced by changing the magnetic field strength, moving a magnet toward or away from the coil, moving the coil into or out of the magnetic field, or changing the amount of current that is flowing through the coil.

In accordance with the well-known law of inductance, if a voltage is forced across an inductor, a current will flow through the inductor, and this current will vary with time. The current flowing in the inductor will be time varying even if the forcing voltage is constant. It is equally true that if a time-varying current is forced to flow in an inductor, a voltage across the inductor will result. The fundamental law that defines the relationship between the voltage and current in an inductor is given by the equation:

$$V = L(di/dt)$$

Thus, current that is constant with time has a di/dt value of zero and results in no voltage across the inductor. A current that is increasing with time has a positive di/dt value, resulting in a positive inductor voltage. Current that decreases with time gives a negative value for di/dt and, thus, for inductor voltage.

Faraday's law implies that a changing magnetic flux produces an electric field even in an empty space. If a metal plate is inserted into this empty space, the induced electric field produces electric currents in the metal. These induced currents are called "eddy currents." If the induced currents are created by a changing magnetic field, then the eddy currents will be perpendicular to the magnetic field and will flow in circles if the B-filed is uniform. The size of the eddy current circles will be proportional to the size of the metal plate.

The induced electric field is nonconservative; the work being done by the generated electric field cannot be recovered except as heat. That is, eddy currents create losses through Joule heating, thereby reducing the efficiency of many devices, e.g. inductors.

As discussed in the above-reference Related application Ser. No. 11/041,658, the market evolution of DC-DC power supply systems indicates that an integrated on-chip inductor with a large inductance and a good Q factor offers a significant market advance in terms of cost competitiveness. New inductor integration schemes are needed to meet these related demands for high values of inductance (with value of 50 nH and greater).

Historically, on-chip inductors are made using interconnect metals on top of a silicon wafer. To reduce resistance of the inductor spiral, thick and wide metal lines are used, increasing the overall size of the inductor. Further, power inductors for DC-DC power supply applications, for example, require even more current carrying capabilities along with larger values of inductance.

The fully integrated DC-DC switching regulator circuit structure described in Related application Ser. No. 11/041,658 utilizes a high inductance, integrated, on-chip inductor structure that has advantages for power applications. As described below, the inductor coil is made of thick metal to reduce resistance. To increase the inductance of the coil, top and bottom magnetic plates are added. The magnetic plates are made of a high permeability material such as ferromagnetic metal alloys, e.g. Permalloy. To further improve the performance of the inductor, the magnetic plates are patterned or made into broken pieces. This patterning of the magnetic layers reduces the eddy current effect, which, as discussed above, degrades the performance of the inductor.

Figure 1B:
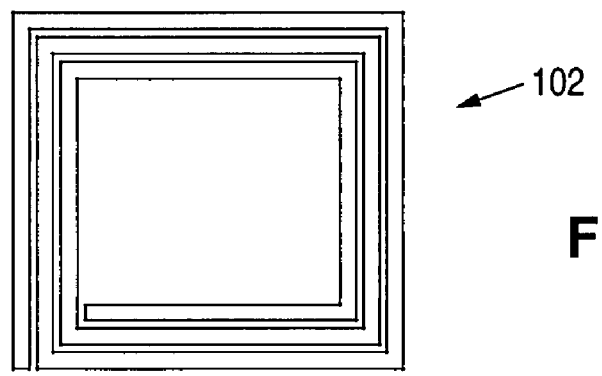
Figure 1C:
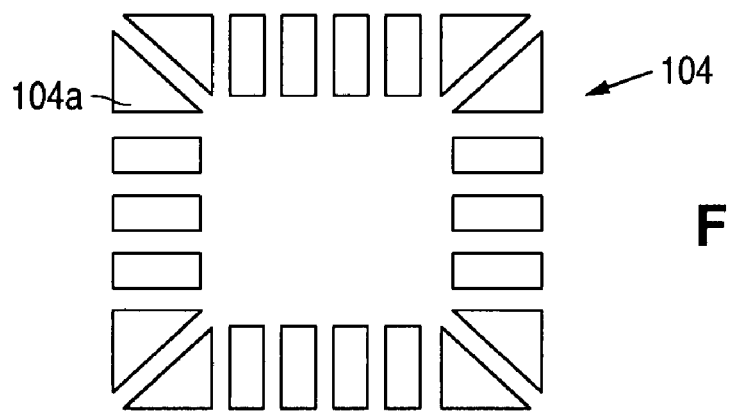

FIGS. 1A-1C combine to show an embodiment of an inductor structure in accordance with the present invention. FIG. 1A shows a top patterned magnetic plate 100 that is subdivided into a plurality of spaced-apart segments 100a. FIG. 1B shows a conductive spiral coil 102. FIG. 1C shows a bottom patterned magnetic plate 104 that is subdivided into a plurality of spaced-apart segments 104a. In the disclosed embodiment, the coil 102 is preferably separated from the top patterned magnetic plate 100 and the bottom patterned magnetic plate 104 by intervening dielectric material such as oxide, nitride or a spin-on polymer (e.g., cured photoresist, polyimide or BCB). However, the dielectric separator can range in thickness from zero to 10 μm, depending upon the current of the inductor. That is, as will be appreciated by those skilled in the art, for inductor currents of 50 mA to 20 Amps, there is a design trade off between low current, high mμ and low saturation and high current, lower mμ and higher saturation.

The top and bottom magnetic plates 100, 104 is preferably a material such as Permalloy (with ratios of 20:80 to 80:20 Ni:Fe), FeCrB, ZrCrTa, CoCr, or CoFeNi; the thickness of the magnetic plates 0.5-1000 microns. The conductor coil is preferably copper 0.5-1000 microns thick.

In the embodiment of the invention shown in FIGS. 1A-1C, the top patterned magnetic plate 100 and the bottom patterned magnetic plate 104 are patterned to be geometrically identical. Although FIGS. 1A-1C show one way of patterning the magnetic layers 100, 104, those skilled in the art will appreciate that other patterns may also be utilized and that the pattern may differ between the top and bottom plates. While it is also known that the magnitude of the eddy current decreases as the size of the pattern increase, those skilled in the art will appreciate that the pattern spacing and pitch are limited by integrated circuit process parameters such as magnetic layer thickness and etch angle.

Figure 2:
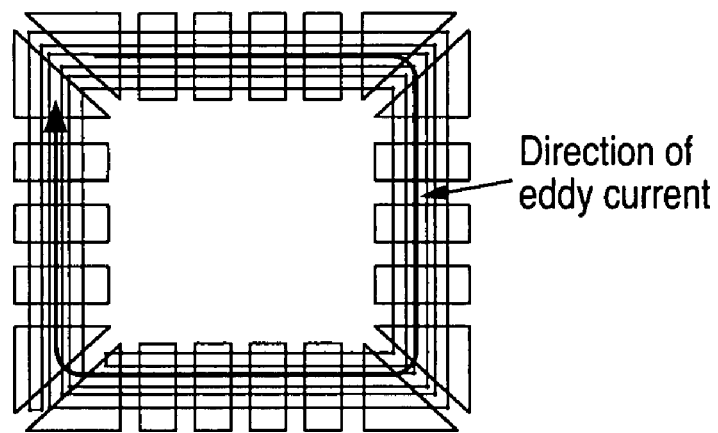
FIG. 2 is a top view illustrating the direction of the eddy currents in the spiral inductor structure shown in FIGS. 1A-1C in accordance with the concepts of the present invention.

FIG. 2 shows a top view of the top patterned magnetic plate 100, the inductor spiral coil 102 and bottom patterned magnetic plate 104 in combination. When current flows along the inductor coil 102, eddy currents inside the magnetic layers are induced in the same direction as the coil, as shown in FIG. 2. By patterning the top magnetic plate 100 and the bottom magnetic plate 104 such that edges between adjacent segments of the pattern are perpendicular to the eddy current path, as illustrated in FIG. 2, the magnitude of the eddy current can be reduced since; as discussed above, the circular eddy currents will be confined to the individual segments compared to the larger circular eddy current that would flow in a singular plate of corresponding size.

Figure 3:
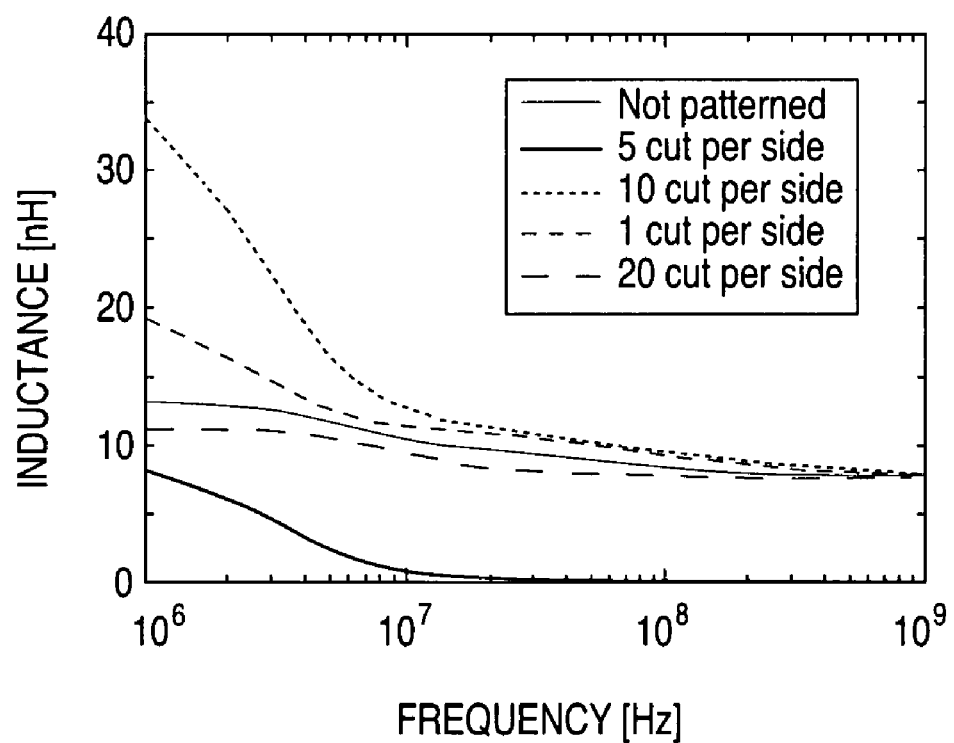
FIG. 3 provides a graph showing simulated inductance as a function of the number of cuts on each side of a magnetic layer in the spiral inductor structure shown in FIGS. 1A-1C.

FIG. 3 shows simulated inductance as a function of the number of "cuts" on each side of the patterned magnetic plates 100, 104. As can be seen from the FIG. 3 plot, when there is no cut in the plates 100, 104, i.e., the plates are singular, monolithic structures, the inductance (nH) decreases significantly at high frequency. As the number of cuts increases, inductance increases at low frequency.

Figure 4A:
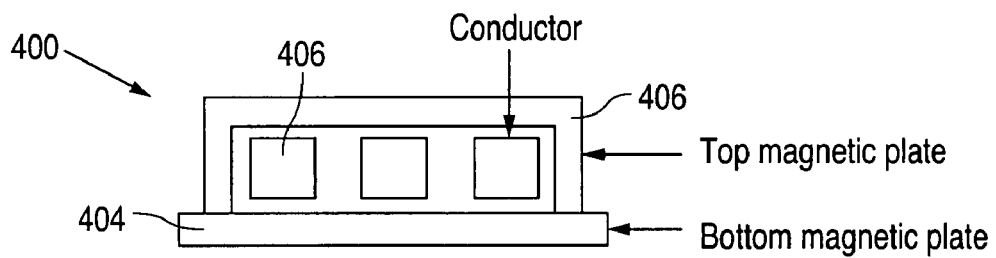
FIG. 4A is a cross section view showing the top and bottom magnetic layers of the FIG. 1A-1C spiral inductor structure touching each other.
Figure 4B:
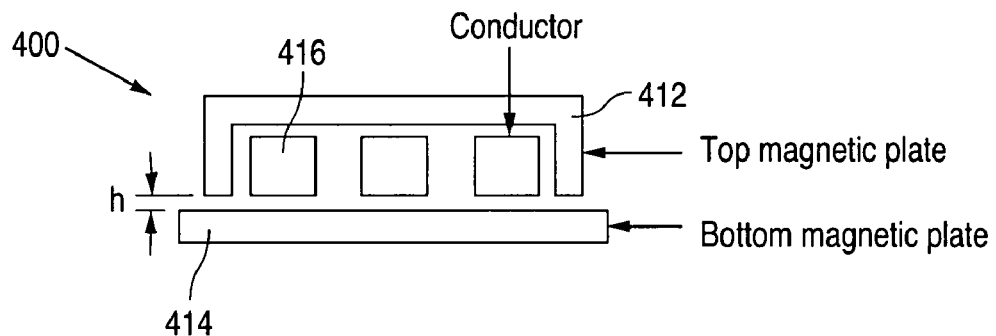
FIG. 4B is a cross section view showing the top and bottom magnetic layers of the FIGS. 1A-1C spiral inductor structure having a finite gap therebetween.
Figure 5:
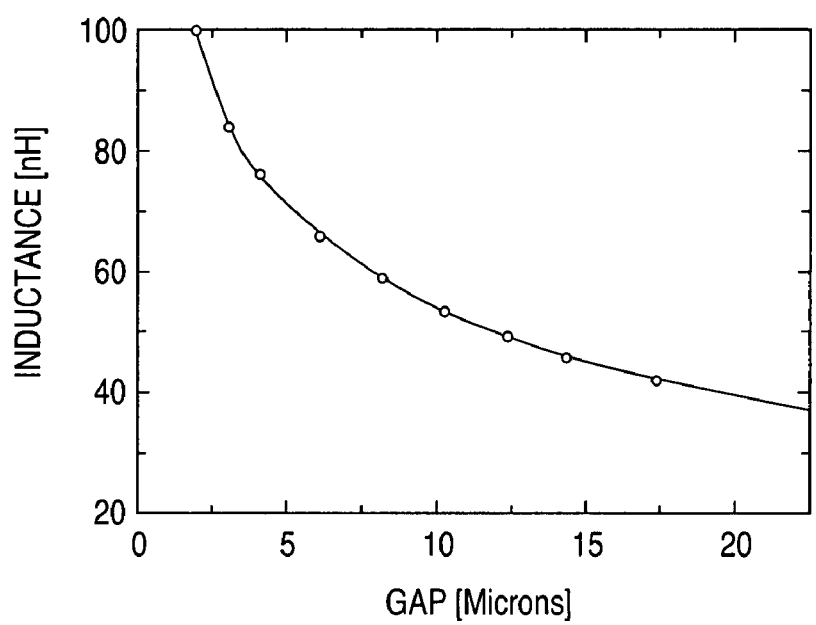
FIG. 5 provides a graph showing simulated inductance as a function of the height of the gap between the top and bottom magnetic plates in the FIG. 4B spiral inductor structure.

FIGS. 4A and 4B show cross-section views of the magnetic inductor structures 400 and 410, respectively, in accordance with the present invention. In the FIG. 4A inductor structure 400, the patterned top magnetic plate 402 and the patterned bottom magnetic plate 404 surround the conductive coil 406 and touch each other; large inductance can be made by this configuration, since reluctance is minimized. In the FIG. 4B inductor structure 410, there is a finite gap (h) between the top patterned magnetic plate 412 and the bottom patterned magnetic plate 414 that surround the coil 416. The magnetic path is composed of the magnetic layers and the gap h. Total inductance can be adjusted by changing the height (h) of the gap. Also, magnetic saturation due to high current level can be controlled by the gap height (h). FIG. 5 shows simulated inductance as a function of the height (h) of the gap between the top magnetic plate 412 and the bottom magnetic plate 414. As can be seen from the FIG. 5 plot, inductance increases as the gap size (h) decreases.

Those skilled in the art will appreciate that the patterned magnetic layer on-chip inductor structures may be fabricated utilizing semiconductor integrated circuit fabrication techniques that are well known to those skilled in the art.

It should also be understood that the particular embodiments of the invention described above have been provided by way of example and that other modifications may occur to those skilled in the art without departing from the scope and spirit of the invention as expressed in the appended claims and their equivalents.

What is claimed is:

1. An inductor structure that is formed as part of a semiconductor integrated circuit, the inductor structure comprising:
   a bottom metal magnetic member formed on an upper surface of a semiconductor substrate;
   a top metal magnetic member formed over and spaced-apart from the bottom metal magnetic member; and
   a conductor coil disposed between the top metal magnetic member and the bottom metal magnetic member and separated from the top and bottom metal magnetic member by intervening dielectric material, the conductor coil adapted for flow of current therethrough,
   wherein at least one of the top metal magnetic member and the bottom metal magnetic member is subdivided into a plurality of spaced-apart segments, each of the spaced-apart segments having edges that are parallel to edges of adjacent segments, the edges being perpendicular to the direction of current flow through the conductor coil.

2. An inductor structure as in claim 1, and wherein both the top metal magnetic member and the bottom metal magnetic member comprise ferromagnetic material.

3. An inductor structure as in claim 2, and wherein the ferromagnetic material comprises permalloy.

4. An inductor structure as in claim 1, and wherein the top metal magnetic member and the bottom metal magnetic member touch each other and surround the conductor coil.

5. An inductor structure as in claim 1, and wherein the top metal magnetic member and the bottom metal magnetic member surround the conductor coil and are separated from each other.

6. An inductor structure comprising:
   a bottom magnetic member formed on an upper surface of a semiconductor substrate, the bottom magnetic member being subdivided into a plurality of spaced-apart segments;
   a top magnetic member formed over and spaced-apart from the bottom magnetic member, the top magnetic member being subdivided into a plurality of spaced-apart segments;
   a conductor coil disposed between the top magnetic member and the bottom magnetic member and separated therefrom by intervening dielectric material, the conductor coil adapted to have current flow therethrough,
   and wherein each spaced-apart segment of the top magnetic member and each spaced-apart segment of the bottom magnetic member has edges that are arranged to be parallel to edges of adjacent segments, the edges being perpendicular to the direction of current flow through the conductor coil.

7. An inductor structure as in claim 6, and wherein both the top magnetic member and the bottom magnetic member comprise ferromagnetic material.

8. An inductor structure as in claim 7, and wherein the ferromagnetic material is selected from the group consisting of permalloy (with ratios of 20:80 to 80:20 Ni:Fe), FeCrB, ZrCrTa, CoCr and CoFeNi.

9. An inductor structure as in claim 6, and wherein the thickness of the top and bottom magnetic members is 0.5-1000 microns.

10. An inductor structure as in claim 9, and wherein the conductor coil comprises copper 0.5-1000 microns thick.

11. An inductor structure as in claim 1, and wherein the top magnetic member and the bottom magnetic member are geometrically identical.

12. An inductor structure as in claim 1, and wherein the top magnetic member and the bottom magnetic member surround the conductor coil and are separated from each other.

13. An inductor structure as in claim 1, and wherein the inductor structure is formed as part of a semiconductor integrated circuit structure.

* * * * *